United States Patent
Shen

(10) Patent No.: US 12,513,856 B2
(45) Date of Patent: Dec. 30, 2025

(54) WATER COOLING RADIATOR PRESSURE REGULATION STRUCTURE

(71) Applicant: ASIA VITAL COMPONENTS CO., LTD., New Taipei (TW)

(72) Inventor: Ching-Hang Shen, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 170 days.

(21) Appl. No.: 18/623,786

(22) Filed: Apr. 1, 2024

(65) Prior Publication Data

US 2025/0287529 A1 Sep. 11, 2025

(30) Foreign Application Priority Data

Mar. 8, 2024 (TW) ................................ 113108706

(51) Int. Cl.
*H05K 7/20* (2006.01)

(52) U.S. Cl.
CPC ..... *H05K 7/20272* (2013.01); *H05K 7/20263* (2013.01); *F25B 2339/044* (2013.01); *H05K 7/20281* (2013.01)

(58) Field of Classification Search
CPC .......... H05K 7/20272; H05K 7/20263; H05K 7/20281; F25B 2339/044
USPC ....................................... 165/104.33, 104.19
See application file for complete search history.

(56) References Cited

U.S. PATENT DOCUMENTS

| | | | | |
|---|---|---|---|---|
| 9,846,001 | B2* | 12/2017 | Ask | F28F 13/00 |
| 2011/0067853 | A1* | 3/2011 | Moser | F28F 27/02 |
| | | | | 165/103 |
| 2019/0104641 | A1* | 4/2019 | Fan | G06F 1/20 |
| 2019/0150324 | A1* | 5/2019 | Krug, Jr. | H05K 7/20781 |
| | | | | 165/104.31 |
| 2019/0254193 | A1* | 8/2019 | Li | H05K 7/20272 |
| 2023/0251047 | A1* | 8/2023 | Feldkeller | F28F 9/0251 |
| | | | | 165/178 |
| 2025/0159840 | A1* | 5/2025 | Dean | F15B 1/04 |

FOREIGN PATENT DOCUMENTS

| | | |
|---|---|---|
| CN | 107339902 A | 11/2017 |
| CN | 216795605 U | 6/2022 |
| TW | M655248 U | 5/2024 |

* cited by examiner

*Primary Examiner* — Joel M Attey
(74) *Attorney, Agent, or Firm* — Demian K. Jackson; Jackson IPG PLLC

(57) ABSTRACT

A water cooling radiator pressure regulation structure includes a water cooling radiator and a regulation unit. The water cooling radiator includes a first chamber, a second chamber, and a flow passage unit located between and communicable with the first and the second chamber; and has a cooling liquid contained therein. The regulation unit is communicable with the water cooling radiator, and includes a regulation chamber, a pressure relief section, and a backflow section. The pressure relief section and the backflow section of the regulation unit regulates the cooling liquid when the latter circulates through the regulation unit, relieves pressure caused by thermal expansion, and flows from the regulation unit back to the water cooling radiator.

7 Claims, 7 Drawing Sheets

WATER COOLING RADIATOR PRESSURE REGULATION STRUCTURE

This application claims the priority benefit of Taiwan patent application number 113108706 filed on Mar. 8, 2024.

FIELD OF THE INVENTION

The present invention relates to the field of water cooling, and more particularly, to a water cooling radiator pressure regulation structure.

BACKGROUND OF THE INVENTION

The existing water cooling system includes some necessary components, such as water block, water cooling radiator, water pump and pipes. The water block, the water cooling radiator, and the water pump are serially connected by the pipes to constitute a closed-circuit system. The water block is in contact with a heat source and a cooling liquid in the water block absorbs heat produced by the heat source. The water pump drives the cooling liquid to flow through the pipes and carry the absorbed heat to an outer environment for heat exchanging and reducing the cooling liquid temperature to achieve the purpose of heat dissipation through cooling liquid circulation.

When the working liquid such as water absorbs heat, it would have an expanded volume but reduced density. The thermally expanded cooling liquid would have a significant influence on the water cooling system that has a fixed volume. For instance, the water block or the water cooling radiator might be pushed by increased liquid pressure in its internal chamber and become deformed, or the joints between the pipes and the water block and/or water cooling radiator might break.

Following problems will occur when the above conditions happened:
(1) The water block is deformed to result in thermal resistance;
(2) The joints of the pipes and different components in the water cooling system burst to result in leaking of the cooling liquid; and
(3) The water cooling radiator would deform to result in poor heat dissipation and the absorbed heat could not be removed effectively.

In other words, any one of the above conditions would lead to failure of the whole water cooling system, which in turn causes undesired problems to the electronic device using the water cooling system, such as crash or burn-out of the electronic device due to overheat or short-circuit due to leakage of the cooling liquid.

Presently, to solve the above problems, a water cooling system with a pressure relief valve provided therein is developed. When the cooling liquid is rise in temperature and accordingly produces additional pressure in the water cooling system, the pressure relief valve opens automatically to balance the internal pressure of the water cooling system. However, the provision of the pressure relief valve causes another problem, i.e. the cooling liquid in the water cooling system will decrease substantially during pressure relief. Since the decreased cooling liquid in turn results in lowered efficiency of the water cooling system, it is necessary to replenish the cooling liquid now and then to maintain the efficiency of the water cooling system.

It is therefore tried by the inventor to develop a water cooling radiator pressure regulation structure to overcome the above problems.

SUMMARY OF THE INVENTION

To overcome the problems in the prior art water cooling system, a primary object of the present invention is to provide a water cooling radiator pressure regulation structure for a water cooling system to regulate automatically the pressure of a cooling liquid circulating through the water cooling system.

Another object of the present invention is to provide a water cooling radiator pressure regulation structure, which enables a cooling liquid to flow back in a water cooling system automatically.

To achieve the above and other objects, the water cooling radiator pressure regulation structure according to the present invention includes a water cooling radiator and a regulation unit. The water cooling radiator includes a first chamber, a second chamber, and a flow passage unit located between and communicable with the first and the second chamber; and has a cooling liquid contained therein. The regulation unit is communicable with the water cooling radiator, and includes a pressure relief section and a backflow section. The pressure relief section and the backflow section of the regulation unit regulate the cooling liquid when the latter circulates through the regulation unit, relieves pressure caused by thermal expansion, and flows from the regulation unit back to the water cooling radiator.

With the above structure, when the cooling liquid in the water cooling system is rise in temperature, a part of the cooling liquid would enter a regulation chamber of the regulation unit via the pressure relief section automatically. On the other hand, when the cooling liquid is dropped in temperature, the cooling liquid that is in the regulation chamber would flow from the regulation chamber back into the water cooling radiator via the backflow section, such that the pressure in the water cooling system is regulated automatically.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
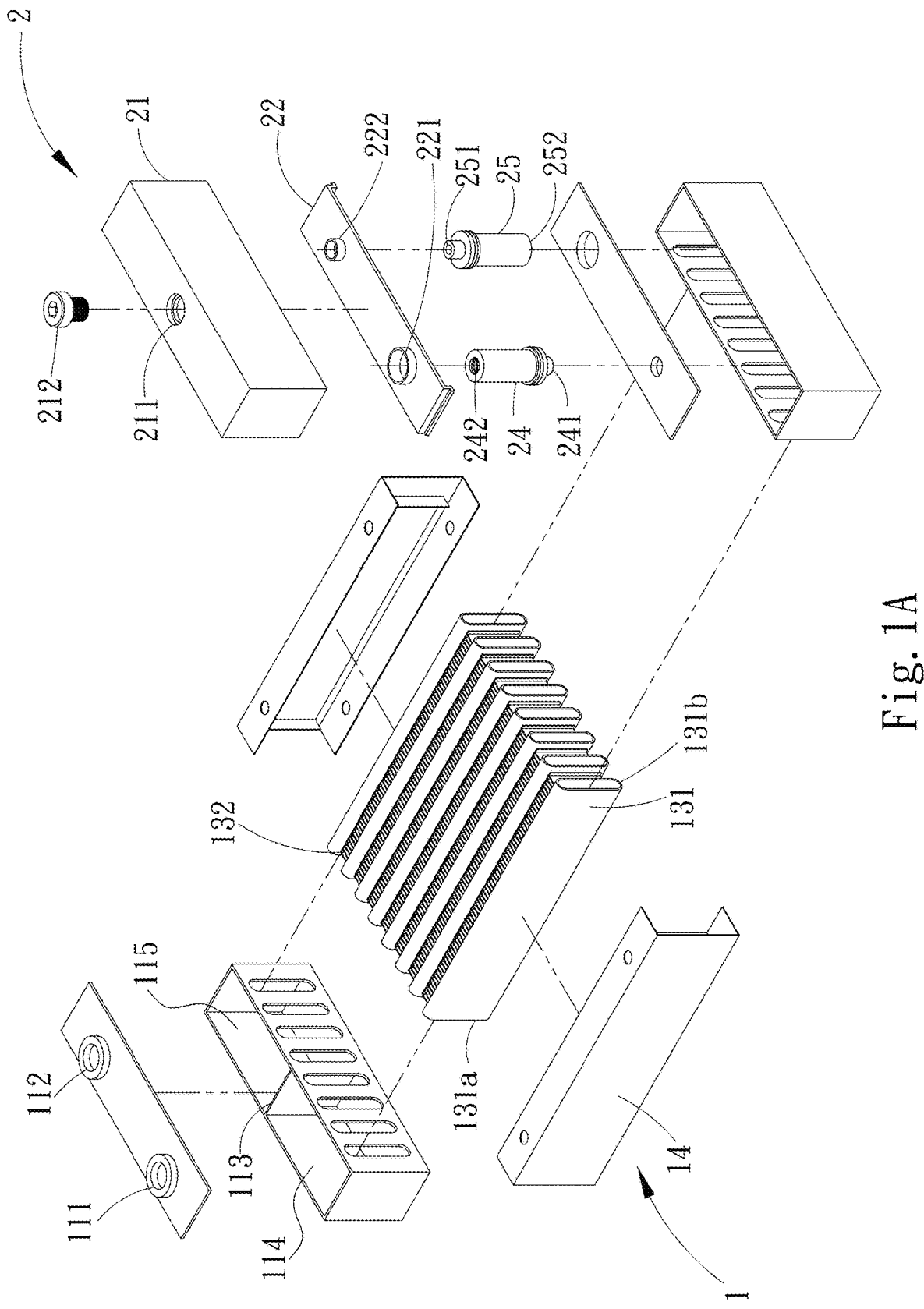
FIG. 1A is an exploded perspective view of a water cooling radiator pressure regulation structure according to a preferred embodiment of the present invention.

The present invention will now be described with some preferred embodiments thereof. For the purpose of easy to understand, elements that are the same in the preferred embodiments are denoted by the same reference numerals.

Figure 1B:
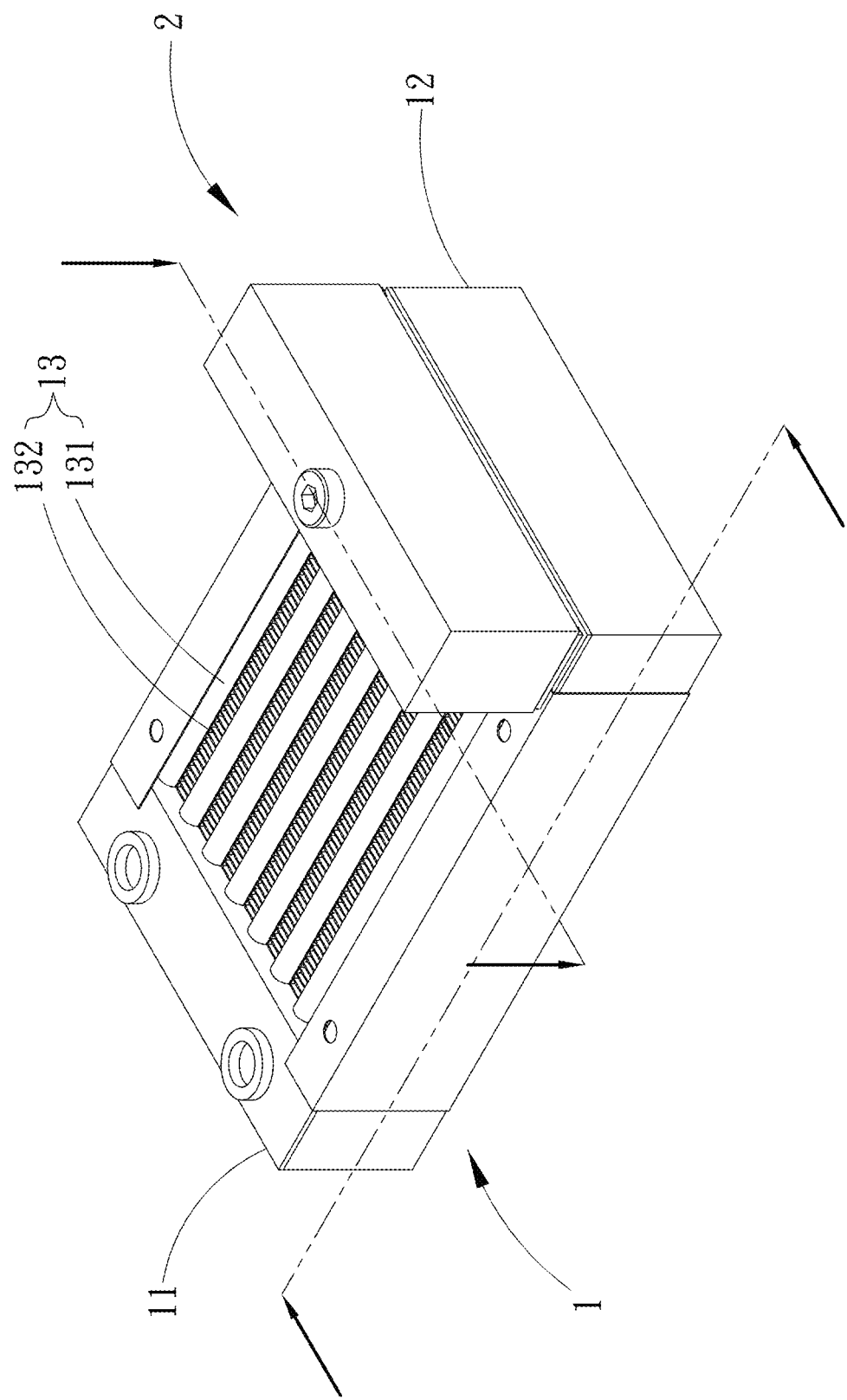
FIG. 1B is an assembled view of FIG. 1A.
Figure 1C:
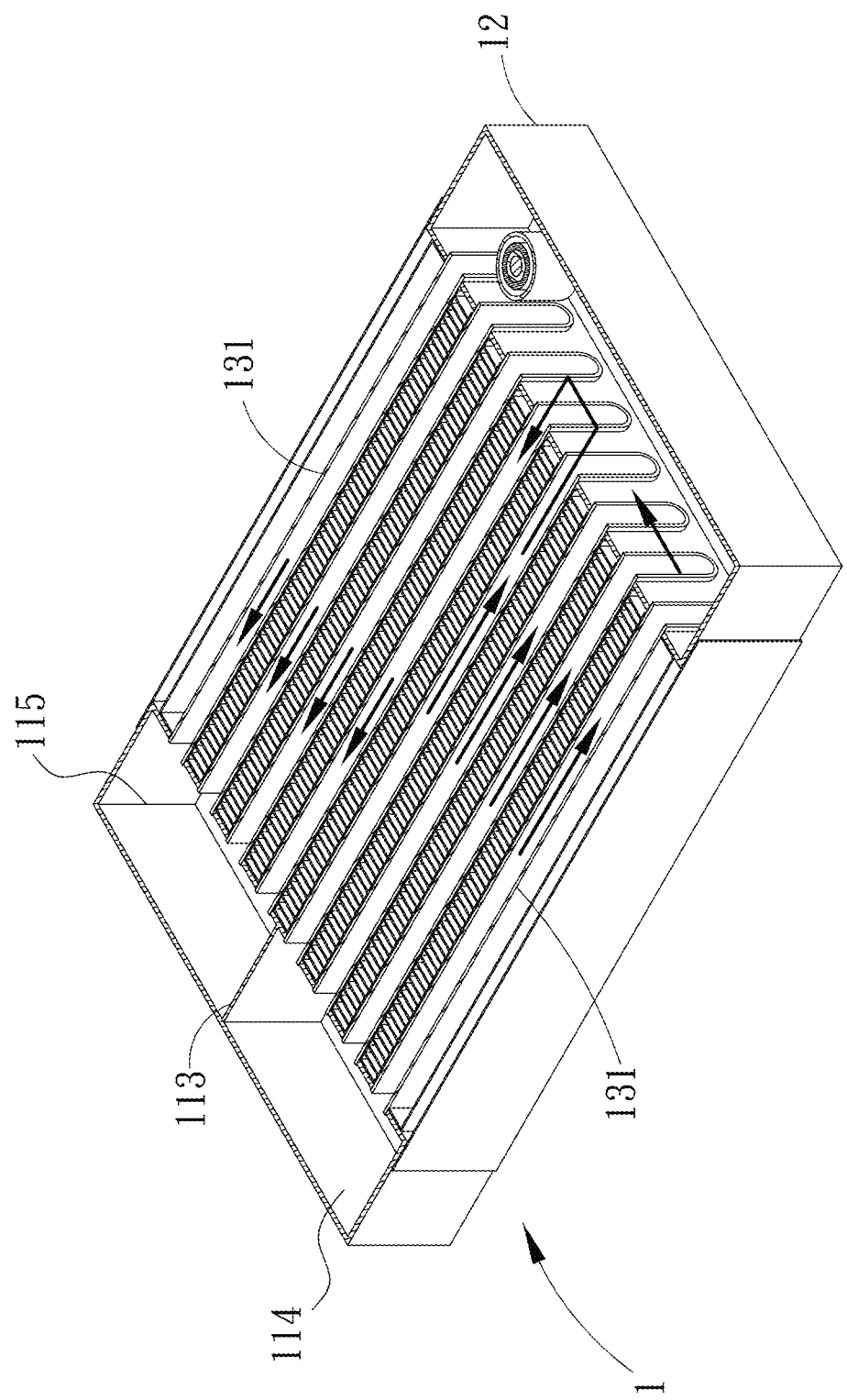
FIG. 1C is a horizontal sectional view of FIG. 1B.
Figure 1D:
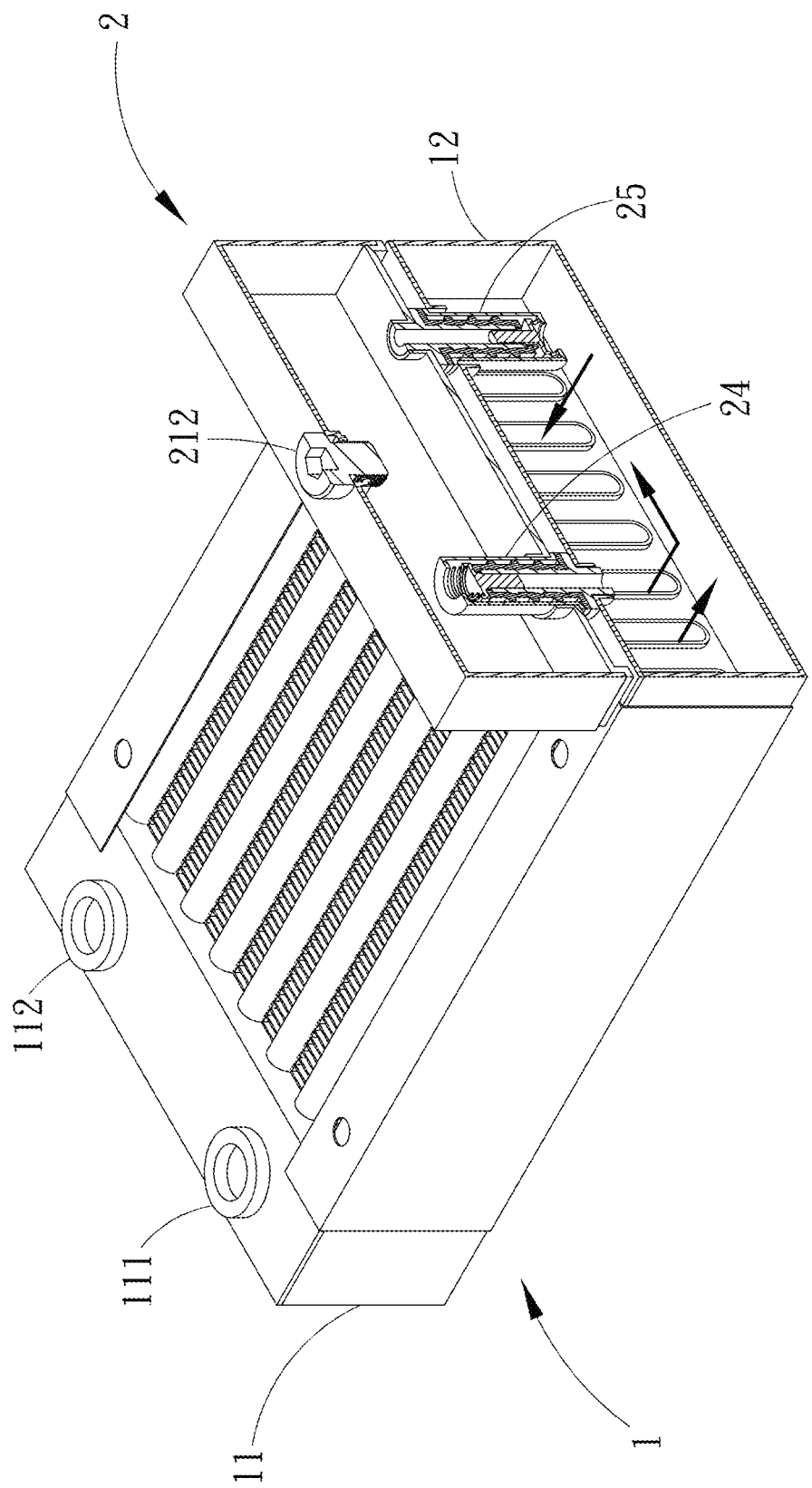
FIG. 1D is a vertical sectional view of FIG. 1B.

Please refer to FIGS. 1A and 1B, which are exploded and assembled perspective views, respectively, of a water cooling radiator pressure regulation structure according to a preferred embodiment of the present invention; and to FIGS. 1C and 1D, which are horizontal and vertical sectional views, respectively, of FIG. 1B. As shown, the water cooling radiator pressure regulation structure of present invention includes a water cooling radiator 1 and a regulation unit 2. The water cooling radiator 1 mainly includes a first chamber 11, a second chamber 12, and a flow passage unit 13. The flow passage unit 13 is located between the first chamber 11 and the second chamber 12 and communicable with the two chambers 11, 12. Further, the water cooling radiator 1 internally contains a cooling liquid.

The first chamber 11 has a liquid inlet 111, a liquid outlet 112, and a partitioning board 113 dividing an internal space of the first chamber 11 into a liquid-in compartment 114 and a liquid-out compartment 115. The liquid inlet 111 is communicably connected to the liquid-in compartment 114, and the liquid outlet 112 is communicably connected to the liquid-out compartment 115.

The flow passage unit 13 includes a plurality of pipes 131 and a plurality of radiating fins 132. The pipes 131 are connected at their respective first end 131a to the first chamber 11, and at their respective second end 131b to the second chamber 12. The pipes 131 are parallelly arranged with the radiating fins 132 located between any two adjacent pipes 13.

The regulation unit 2 includes a first case member 21 and a second case member 22. The first and the second case member 21, 22 are connected with each other to together define a regulation chamber 23 between them. The second case member 22 are provided with a pressure relief section 221 having a first check valve assembly 24 mounted thereto and a backflow section 222 having a second check valve assembly 25 mounted thereto. The first check valve assembly 24 includes a lower inlet 241 and an upper outlet 242; and the second check valve assembly 25 includes an upper inlet 251 and a lower outlet 252. The first case member 21 is provided with a through bore 211 for receiving a sealing element 212, such as a stopper, a spigot, or a plug therein.

The regulation unit 2 is communicable with the water cooling radiator 1. In the illustrated preferred embodiment, the regulation unit 2 is connected to a top of the second chamber 12. The first check valve assembly 24 is communicably connected at the lower inlet 241 to the second chamber 12, and at the upper outlet 242 to the pressure relief section 221 of the regulation unit 2. The second check valve assembly 25 is communicably connected at the lower outlet 252 to the second chamber 12, and at the upper inlet 251 to the backflow section 222 of the regulation unit 2.

The arrows in the drawings indicate flow directions of the cooling liquid. Please refer to FIGS. 1A, 1C and 1D. The cooling liquid enters the liquid-in compartment 114 via the liquid inlet 111 and then flows from the first ends 131a of the pipes 131 that are located at a first side in the flow passage unit 13 (i.e. the left side when viewing in front of the drawing) toward the second ends 131b of the same pipes 131 into the second chamber 12. Thereafter, the cooling liquid in the second chamber 12 flows from the second ends 131b of the pipes 131 that are located at a second side (or a right side) in the flow passage unit 13 toward the first ends 131a of the same pipes 131 into the liquid-out compartment 115, from where the cooling liquid leaves the water cooling radiator 1 via the liquid outlet 112.

Figure 2A:
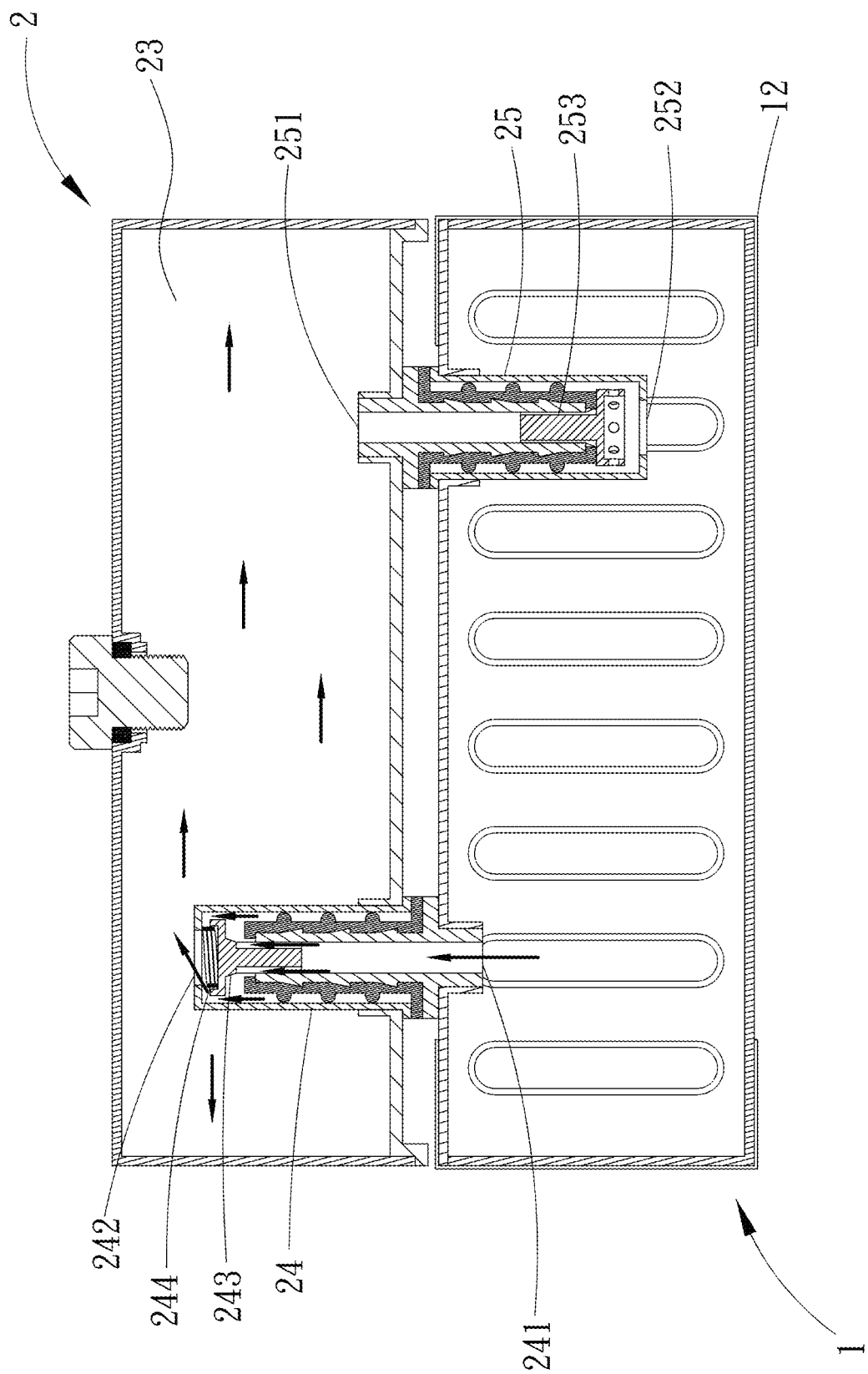
FIG. 2A is an end sectional view showing how the water cooling radiator pressure regulation structure of the present invention works when a cooling liquid therein is rise in temperature.
Figure 2B:
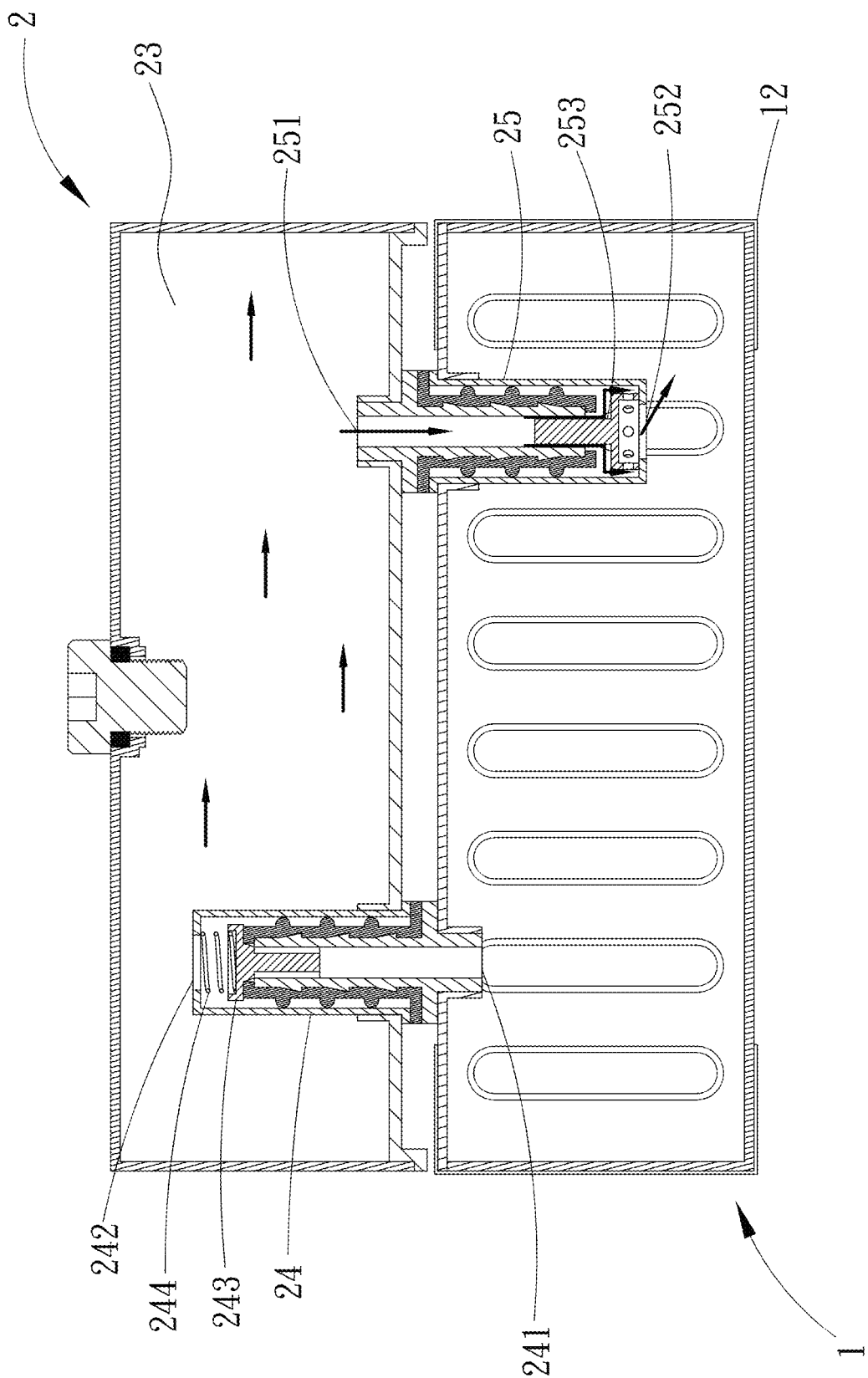
FIG. 2B is another end sectional view showing how the water cooling radiator pressure regulation structure of the present invention works when the cooling liquid therein is dropped in temperature.
Figure 3:
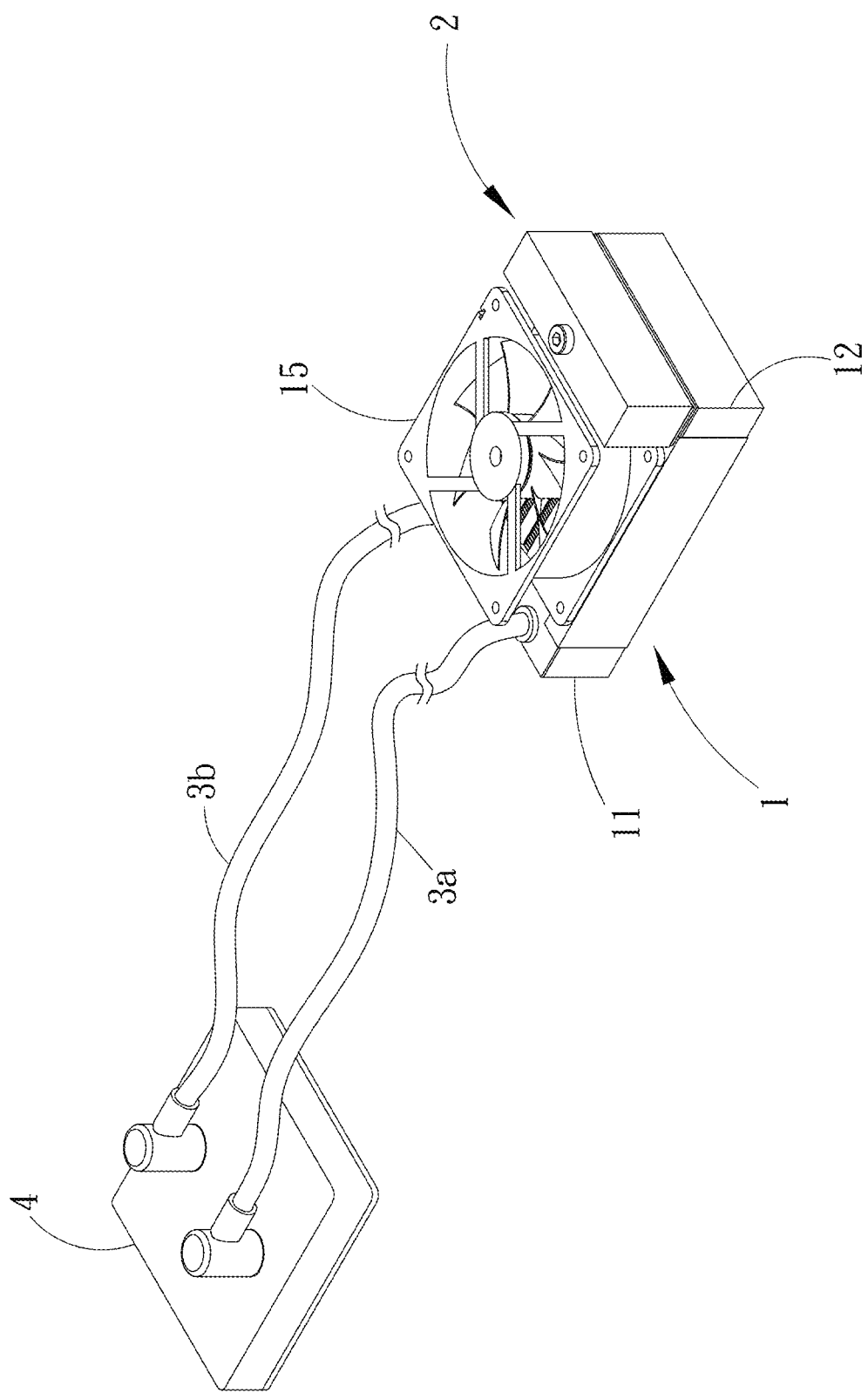
FIG. 3 shows a water cooling system using the water cooling radiator pressure regulation structure of the present invention.

FIGS. 2A and 2B are sectional views showing how the water cooling radiator pressure regulation structure of the present invention works, and FIG. 3 shows a water cooling system using the water cooling radiator pressure regulation structure of the present invention. Please refer to FIGS. 2A, 2B and 3 along with FIGS. 1A to 1D. In the water cooling radiator pressure regulation structure of the present invention, the liquid inlet 111 and the liquid outlet 112 of the water cooling radiator 1 are connected to an end of pipes 3a and 3b, respectively; while another end of the pipes 3a, 3b are connected to a water block 4. A set of protection covers 14 (see FIG. 1A) is provided on an outer side of the flow passage unit 13 of the water cooling radiator 1 and a fan 15 is mounted on a top of the protection covers 14 (see FIG. 3) to form a complete water cooling system. Please refer to FIG. 2A, which shows the state in the water cooling radiator pressure regulation structure of the present invention when the cooling liquid is rise in temperature. It is noted the cooling liquid in a temperature raised condition would expand to have reduced density and generate increased pressure. As a result, the expanded cooling liquid will pass the lower inlet 241 to push against a first valve 243 of the first check valve assembly 24 and pass the lower outlet 252 to push against a second valve 253 of the second check valve assembly 25. The first valve 243 subjected to the pressure pushes a first elastic element 244 upward in the first check valve assembly 24 and accordingly, a gap is formed in the first check valve assembly 24. With the gap, the cooling liquid is allowed to flow from the second chamber 12 through the gap in the first check valve assembly 24 into the regulation chamber 23. Meanwhile, the second valve 253 subjected to the pressure is fully attached to and seals a sleeve of the second check valve assembly 25, such that the cooling liquid can enter the regulation chamber 23 only via the first check valve assembly 24.

Please refer to FIG. 2B, which shows the state in the water cooling radiator pressure regulation structure of the present invention when the cooling liquid is dropped in temperature. It is noted that the cooling liquid in a temperature lowered condition would restore from expanded volume and reduced density to a normal volume and density, and accordingly generate less pressure. At this point, the first valve 243 and the second valve 253 would be forced to move toward the second chamber 12 due to the weight of the cooling liquid in the regulation chamber 2 and the reduced pressure in the second chamber 12. Meanwhile, the first elastic element 244 of the first check valve assembly 24 also elastically restores to its original position to push against the first valve 243, bringing the first valve 243 to fully contact with and accordingly seal a sleeve of the first check valve assembly 24. On the other hand, the second valve 253 moves naturally toward the second chamber 12 under gravitational force, which results in the formation of a gap between the sleeve and the second check valve 253 of the second check valve assembly 25. Therefore, the cooling liquid can flow from the regulation chamber 23 of the regulation unit 2 through the gap in the second check valve assembly 25 into the second chamber 12.

The position of the first valve 243 and the second valve 253 changes (i.e. rises or sinks) with the temperature of the cooling liquid. Since the second chamber 12 and the regulation unit 2 communicate with each other via the pressure relief section 221 and the backflow section 222, the additional volume of the expanded cooling liquid in the second chamber 12 resulted from the rising temperature thereof would flow from the second chamber 12 into the regulation chamber 23 via the pressure relief section 221; and the cooling liquid stayed in the regulation chamber 23 would flow through the backflow section 222 into the second chamber 12 again when the temperature of the cooling liquid drops. In this manner, the cooling liquid is regulated when it circulates through the regulation chamber 23, relieves pressure caused by thermal expansion, and flows backward into the second chamber 12.

The sealing element 212 can be removed to expose the through bore 211 for filling the cooling liquid at the first use of the whole water cooling system or when it is necessary to replenish or replace the cooling liquid. The cooling liquid is filled into the regulation unit 2 via the through bore 211. When the regulation unit 2 is fully filled with the cooling liquid, any cooling liquid being further filled into the regulation unit 2 would impose a force to push open the second valve 253 of the second check valve assembly 25 and flow into the second chamber 12 to circulate through the whole water cooling system.

In the illustrated preferred embodiment, the regulation unit 2 is connected to the top of the second chamber 12. However, in other alternative embodiments, the regulation unit 2 may be otherwise connected to a top of the first chamber 11 or straddled between the first and the second chamber 11, 12. In the case of being disposed on the top of the first chamber 11, the regulation unit 2 works just in the same principle as it is located above the second chamber 12 without being influenced by the difference in its position. For the cooling liquid to flow back under the gravitational force in this case, the liquid inlet 111 and the liquid outlet 112 are changed to two sides of the first chamber 11. When the regulation unit 2 is straddled between the first and the second chamber 11, 12, the first check valve assembly 24 and the second check valve assembly 25 are not particularly limited to be communicable with a specific one of the first and the second chamber 11, 12, respectively. For example, in one of many alternative embodiments, the first check valve assembly 24 is communicable with the first chamber 11 while the second check valve assembly 25 is communicable with the second chamber 12. However, it is understood the present invention is not limited to the above embodiments. In a further embodiment, the first check valve assembly 24 is communicable with the second chamber 12 while the second check valve assembly 25 is communicable with the first chamber 11.

In the above cooling liquid circulation process, no additional operation is needed. The pressure of the cooling liquid in the water cooling radiation 1 is automatically regulated with the change in the temperature of the heat source to avoid undesirable problems or damages of the water cooling system due to overpressure.

Briefly, the water cooling radiator pressure regulation structure of the present invention has the following advantages:

(1) It is able to regulate the pressure of the cooling liquid automatically;
(2) It does not need replenishment of the cooling liquid frequently; and
(3) It has simple structure.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A water cooling radiator pressure regulation structure, comprising:
   a water cooling radiator including a first chamber, a second chamber, and a flow passage unit located between and communicable with the first and the second chamber; and
   the water cooling radiator internally containing a cooling liquid; and a regulation unit being communicable with the water cooling radiator and including a pressure relief section and a backflow section for regulating the cooling liquid when the latter circulates through the regulation unit, relieves pressure caused by thermal expansion, and flows from the regulation unit back to the water cooling radiator wherein the regulation unit includes a first case member and a second case member, which are connected with each other to together define a regulation chamber between them; the pressure relief section and the backflow section being provided on the second case member; the pressure relief section having a first check valve assembly mounted thereto; and the backflow section having a second check valve assembly mounted thereto.

2. The water cooling radiator pressure regulation structure as claimed in claim 1, wherein the first check valve assembly has a lower inlet and an upper outlet, the lower inlet being communicable with the second chamber, and the upper outlet being communicable with the regulation unit.

3. The water cooling radiator pressure regulation structure as claimed in claim 1, wherein the second check valve assembly has an upper inlet and a lower outlet, the upper inlet being communicable with the regulation unit, and the lower outlet being communicable with the second chamber.

4. The water cooling radiator pressure regulation structure as claimed in claim 1, wherein the first case member is provided with a through bore, in which a sealing element is removably fitted.

5. The water cooling radiator pressure regulation structure as claimed in claim 1, wherein the first chamber is provided with a liquid inlet, a liquid outlet, and a partitioning board dividing an internal space of the first chamber into a liquid-in compartment and a liquid-out compartment; and the liquid inlet and the liquid outlet being communicably connected to the liquid-in compartment and the liquid-out compartment, respectively.

6. The water cooling radiator pressure regulation structure as claimed in claim 1, wherein the flow passage unit includes a plurality of pipes and a plurality of radiating fins; the pipes having their respective first end connected to the first chamber and their respective second end connected to the second chamber; and the radiating fins being located between any two adjacent pipes.

7. The water cooling radiator pressure regulation structure as claimed in claim 1, wherein the flow passage unit includes a set of protection covers, onto which a fan is mounted.

* * * * *